(12) United States Patent
Or et al.

(10) Patent No.: US 6,672,503 B2
(45) Date of Patent: Jan. 6, 2004

(54) METHOD OF BONDING WIRES

(75) Inventors: Siu Wing Or, Kowloon (HK); Honghai Zhu, Singapore (SG); Yam Mo Wong, Singapore (SG); Honyu Ng, Singapore (SG)

(73) Assignee: ASM Technology Singapore PTE LTD (SG)

( * ) Notice: Subject to any disclaimer, the term of this patent is extended or adjusted under 35 U.S.C. 154(b) by 11 days.

(21) Appl. No.: 09/960,042

(22) Filed: Sep. 21, 2001

(65) Prior Publication Data

US 2002/0060239 A1 May 23, 2002

(51) Int. Cl.[7] .................. B23K 31/02; B23K 37/00; B23K 1/06; B23K 31/12
(52) U.S. Cl. .................. 228/180.5; 228/4.5; 228/1.1; 228/110.1; 228/102; 228/103
(58) Field of Search ............... 228/180.5, 4.5, 228/1.1, 110.1, 102, 103, 56.21, 56.22; 219/56.21, 56.22

(56) References Cited

U.S. PATENT DOCUMENTS

| | | | | |
|---|---|---|---|---|
| 4,586,642 A | * | 5/1986 | Dreibelbis et al. | 228/4.5 |
| 5,115,960 A | * | 5/1992 | Shimizu | 228/110.1 |
| 5,469,011 A | | 12/1993 | Safabakhsh | 310/325 |
| 5,275,324 A | | 1/1994 | Yamazaki et al. | 228/1.1 |
| 5,360,155 A | | 11/1994 | Ooki et al. | 228/1.1 |
| 5,377,894 A | * | 1/1995 | Mizoguchi et al. | 228/1.1 |
| 5,578,888 A | | 11/1996 | Safabakhsh | 310/328 |
| 5,699,953 A | * | 12/1997 | Safabakhsh | 228/110.1 |
| 5,816,476 A | * | 10/1998 | Buice et al. | 228/102 |
| 5,884,834 A | * | 3/1999 | Vinson et al. | 228/102 |
| 6,279,810 B1 | * | 8/2001 | Chan-Wong et al. | 228/1.1 |

OTHER PUBLICATIONS

European Search Report No. SG00/00154 dated Jun. 7, 2001

* cited by examiner

*Primary Examiner*—Tom Dunn
*Assistant Examiner*—L. Edmondson
(74) *Attorney, Agent, or Firm*—Ostrolenk, Faber, Gerb & Soffen, LLP

(57) ABSTRACT

A method of bonding wires between a semiconductor die and a substrate on which the die is mounted includes providing an ultrasonic transducer (1). The transducer (1) includes an ultrasonic energy generation device (2), an ultrasonic vibration amplifying device (3) coupled at one end (10) to the ultrasonic energy generation device (2), a bonding tool (5) coupled to the opposite end (12) of the ultrasonic vibration amplifying device (3), and a mounting structure (4) located between the ends (10, 12) of the ultrasonic vibration amplifying device (3). The method also includes performing a first wire bond by operating the ultrasonic transducer (1) at a first ultrasonic frequency and performing a second wire bond by operating the ultrasonic transducer (1) at a second ultrasonic frequency, the second ultrasonic frequency being different from the first ultrasonic frequency.

15 Claims, 3 Drawing Sheets

METHOD OF BONDING WIRES

FIELD OF THE INVENTION

The invention relates to a method of wire bonding and especially, a method of forming wire bonds on electronic devices using an ultrasonic transducer.

BACKGROUND TO THE INVENTION

Ultrasonic wire bonding is used to attach electrically conducting wires between contact pads on a semiconductor die and contact areas on a substrate, such as a leadframe, to which the die is attached prior to the electronic device and substrate assembly being encapsulated.

Conventional ultrasonic transducers for wire bonding comprise a piezoelectric driver/motor which is coupled to one end of an ultrasonic vibration amplifying horn. The amplifying horn includes a mounting structure (commonly known as a barrel or a collar) which permits the transducer to be mounted on a wire bonding machine. Mounted at the opposite end of the amplifying horn from the piezoelectric driver/motor is a bonding tool, commonly known as a capillary, through which the wire to be bonded extends during a wire bonding operation. Therefore, the mounting structure is located between piezoelectric driver/motor and the bonding tool.

As the mounting structure is offset from the piezoelectric driver/motor, in order to obtain the most efficient ultrasonic bonding, a zero amplitude of vibration (or node) should occur at the piezoelectric driver and at the point of contact between the mounting structure and the wire bonding machine, and a maximum amplitude of vibration should occur at the bonding tool.

In practice, due to these constraints, it has only been possible to operate this conventional type of ultrasonic transducer at a single frequency which is the design frequency specified by the manufacturer of the transducer. If it is desired to use a different frequency for the bonding operation, then it is necessary to replace the transducer with another transducer with a different specified design frequency.

In order to overcome the limitations of these conventional ultrasonic transducers, U.S. Pat. No. 5,578,888 proposes an ultrasonic transducer which is symmetrical about the mounting axis and has a piezoelectric driver with a central axis that is coincident with the mounting axis. Designing the transducer with the piezoelectric driver coincident with the mounting axis enables the transducer to be operated at more than one resonant frequency to perform wire bonding operations at difference frequencies.

However, a disadvantage of the transducer proposed in U.S. Pat. No. 5,578,888 is that it requires a specially designed and constructed transducer.

SUMMARY OF THE INVENTION

In accordance with a first aspect of the present invention, a method of bonding wires between a semiconductor die and a substrate on which the die is mounted comprising providing an ultrasonic transducer comprising an ultrasonic energy generation device, an ultrasonic vibration amplifying device coupled at one end to the ultrasonic wave generation device, a bonding tool coupled to the opposite end of the ultrasonic vibration amplifying device, and a mounting structure located between the ends of the ultrasonic vibration amplifying device; performing a first wire bond by operating the ultrasonic transducer at a first ultrasonic frequency and performing a second wire bond by operating the ultrasonic transducer at a second ultrasonic frequency, the second ultrasonic frequency being different from the first ultrasonic frequency.

Preferably, the method further comprises identifying two ultrasonic frequencies of vibration of the energy generation device at which the vibration amplitude is:

(i) substantially zero at an energy generation plane, the energy generation plane being perpendicular to a longitudinal axis extending between the ultrasonic generation device and the bonding tool and the energy generation plane intersecting the ultrasonic generation device;

(ii) substantially zero at a mounting plane, the mounting plane being perpendicular to the longitudinal axis and being coincident with a mounting contact point between the mounting structure and a wire bonding machine on which the transducer is mounted; and (iii) non-zero at a bonding plane, the bonding plane being perpendicular to the longitudinal axis and intersecting the bonding tool.

Preferably, the vibration amplitude is substantially a maximum at the bonding plane.

Typically, the first wire bond bonds a wire to a contact pad on the die and the second wire bond bonds a wire to a contact area on the substrate.

Typically, the method may include identifying further frequencies at which the amplitude of vibration is substantially zero at the energy generation plane and the mounting plane and substantially a maximum at the bonding plane, and performing a wire bond operation using one of the further identified frequencies.

In accordance with a second aspect of the present invention, wire bonding apparatus comprises an ultrasonic transducer comprising an ultrasonic energy generation device, an ultrasonic vibration amplifying device coupled at one end to the ultrasonic wave generation device, a bonding tool coupled to the opposite end of the ultrasonic vibration amplifying device, and a mounting structure located between the ends of the ultrasonic vibration amplifying device; and a signal generator having an output coupled to the energy generation device; the signal generator being adapted to generate at least one of a first and a second ultrasonic frequency to operate the energy generation device at the first or the second ultrasonic frequency, the first ultrasonic frequency being different from the second ultrasonic frequency.

Preferably, the apparatus further comprises a controller coupled to the signal generator to control which of the first and the second ultrasonic frequencies is generated by the signal generator.

Preferably, the apparatus also comprises feedback means coupled to the controller, the controller controlling the ultrasonic frequency generated by the signal generator in response to feedback signals received from the feedback means.

BRIEF DESCRIPTION OF THE DRAWINGS

An example of a method of performing a wire bond in accordance with the invention will now be described with reference to the accompanying drawings, in which.

DESCRIPTION OF THE PREFERRED EMBODIMENT

Figure 1:
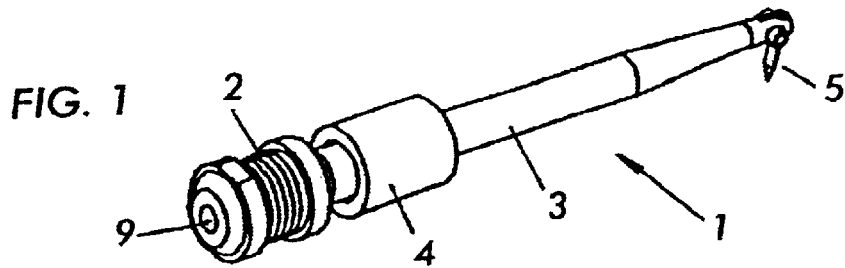
FIG. 1 is a perspective view of a conventional ultrasonic transducer for wire bonding.
Figure 2:
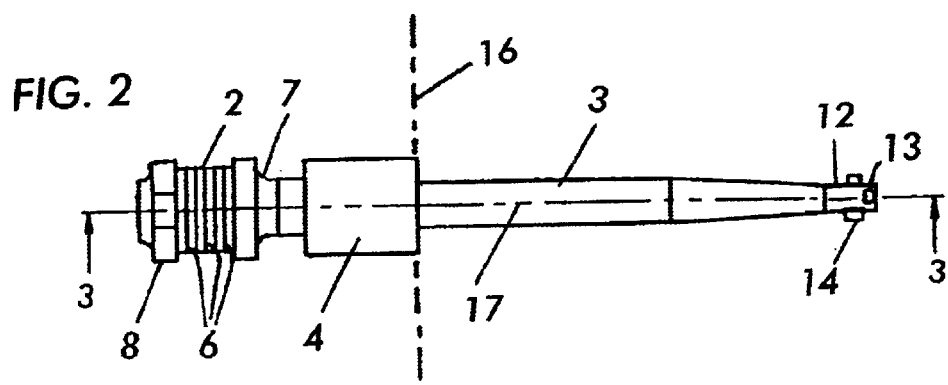
FIG. 2 is a plan view of the ultrasonic transducer.

FIGS. 1 to 4 show an ultrasonic transducer 1 which includes an ultrasonic energy generation device in the form of a piezoelectric driver 2, an amplifying horn 3 having a collar 4 integrally formed on the horn 3 and a bonding tool in the form of a capillary 5. The transducer 1 has a manufacturer's specified design frequency of 138 kHz.

The piezoelectric driver 2 is a Langevin's sandwich type piezoelectric vibrator/motor with a number of piezoelectric elements 6 which are stacked together and sandwiched between a flange 7 mounted at a first end 10 at the horn 3 and a retaining flange 8. The retaining flange 8 is secured in position by a retaining screw 9 which is threaded into the flange 7. The flange 7 is secured to the horn 3 by being threaded into a threaded bore 11 in the first end 10 of the horn 3.

At a second end 12 of the horn 3 is located the capillary tip 5, which is located in a through bore 13 in the end 12 and is retained in position by a screw 14.

Figure 3:
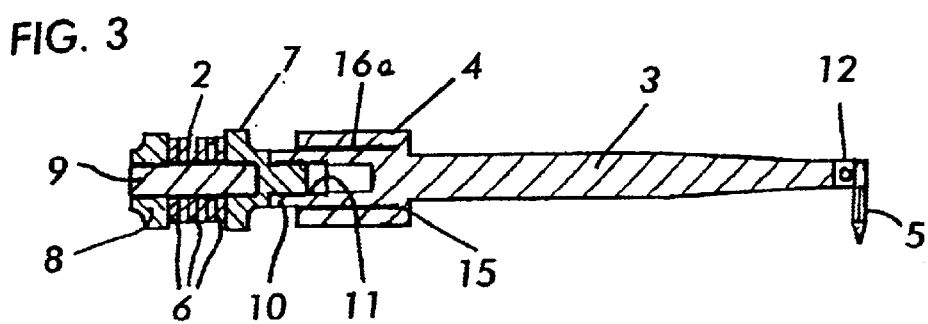
FIG. 3 is a cross-sectional view of the ultrasonic transducer along the line A—A of FIG. 2.
Figure 4:
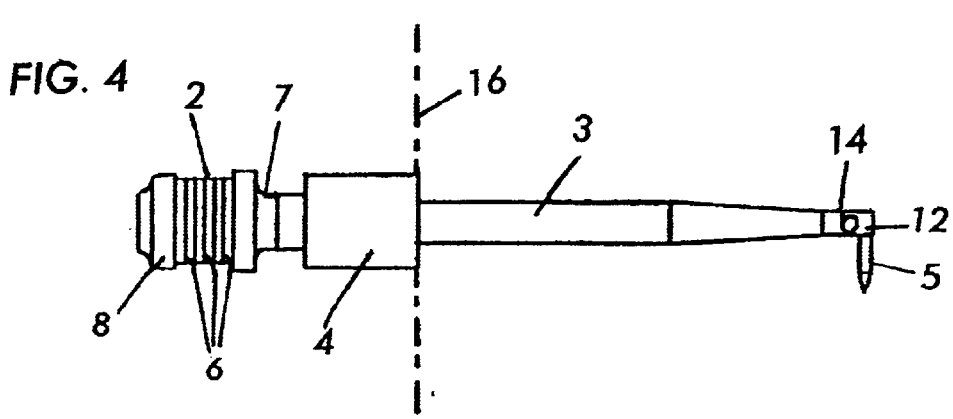
FIG. 4 is a side view of the ultrasonic transducer.

The horn 3 and collar 4 is typically metal. As shown in FIG. 3, the collar 4 is attached to the horn 3 by a metal section 15. The collar 4 and horn 3 define an annular gap 16. When the transducer 1 is mounted in a wire bonding machine, the mounting structure contacts the wire bonding machine at a mounting plane 16 which is perpendicular to a longitudinal axis 17 of the transducer 1.

A conventional ultrasonic transducer, such as the transducer 1 shown in FIGS. 1 to 4, is designed and supplied by a manufacturer with a specified design frequency at which it should be operated. If a user wishes to perform a wire bond at a different ultrasonic frequency, for example, due to different type of materials being bonded, it is necessary to change the ultrasonic transducer in the wire bonder to a different transducer with the specified design frequency matching the frequency at which it is desired to perform the bonding operation.

However, the inventors have found that this type of conventional ultrasonic transducer 1 can be used to perform bonding operations at frequencies other than the specific design frequency.

In the context of this application, the term "conventional ultrasonic transducer" is defined as meaning an ultrasonic transducer for performing wire bond operations on semiconductor dies, and in which the mounting plane of the transducer does not Intersect the ultrasonic energy generation device of the transducer. The term "mounting plane" means a plane perpendicular to the longitudinal axis of the transducer and which is coincident with the point at which the mounting structure of the transducer engages with a wire bonding machine on which the transducer is mounted.

An analysis of the vibration characteristics of the transducer 1 can be performed using conventional theoretical and computational modeling methods using commercial software packages which use, for example, finite element analysis. Such modeling enables the modes of vibration which can be excited in a given frequency range to be determined and to accurately characterize the corresponding mode shapes and vibration amplitude fields. It also enables the vibration amplitude at any location on the transducer to be determined for a given boundary condition, taking into account the material properties and damping phenomena of the transducer 1.

Figure 5:
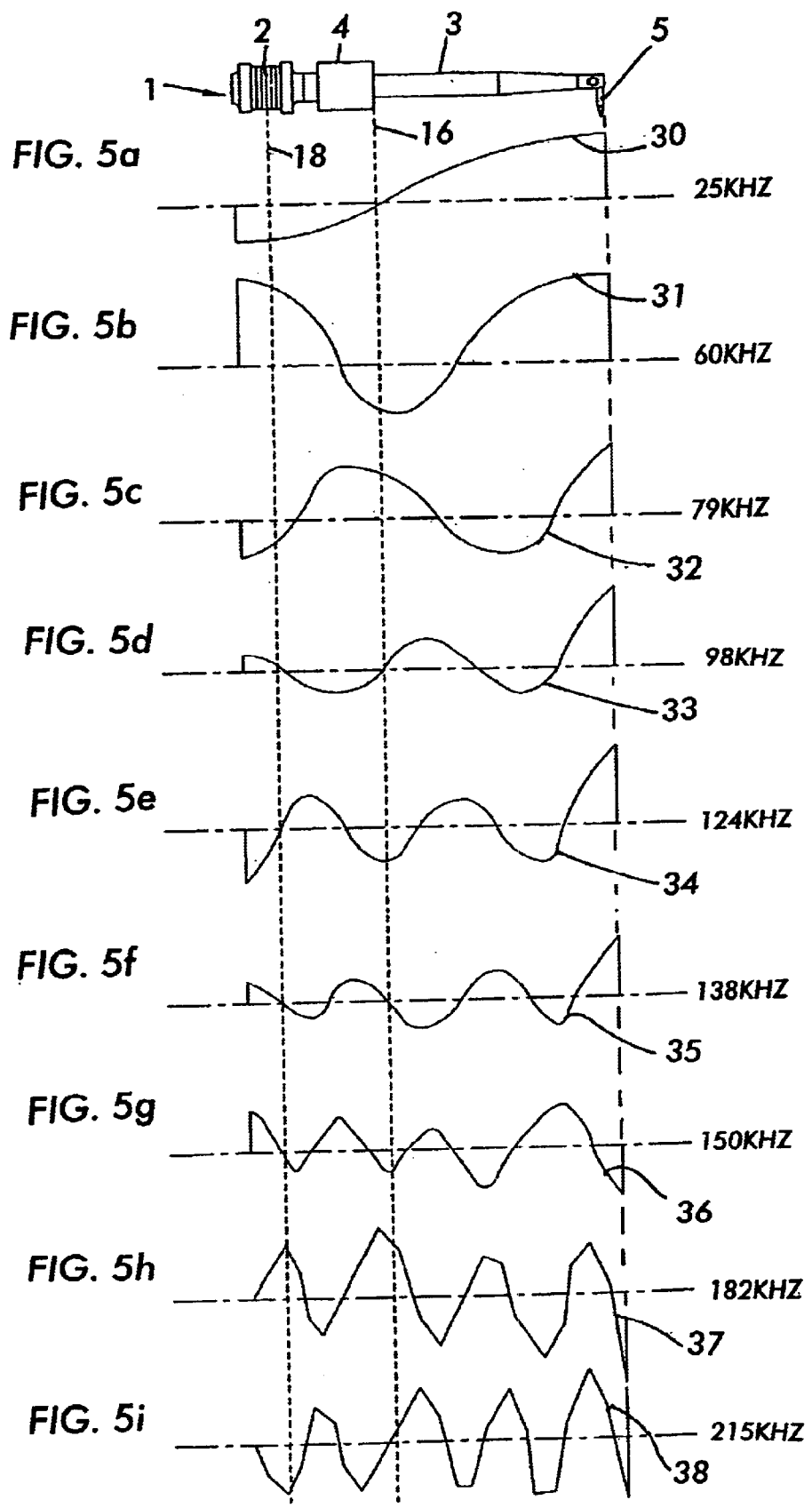
FIGS. 5a to 5i are graphs showing the vibration amplitude distribution for a number of different ultrasonic frequencies along the length of the transducer shown in FIGS. 1 to 4.

Analyzing the transducer 1 using the above described modeling methods over an ultrasonic frequency range from 0 kHz to 240 kHz showed that the transducer 1 has nine longitudinal axial modes of vibration 30, 31, 32, 33, 34, 35, 36, 37, 38, as shown in FIGS. 5a to 5i. It is noted that FIG. 5f shows the sixth vibrational mode 35 at 138 kHz. This sixth mode 35 has a total of three wavelengths, and is the specified design frequency of the transducer 1. It is noted that at an energy generation plane 18 and the mounting plane 16, the sixth vibrational mode 35 has a zero amplitude of vibration and at the capillary tip 5 has a maximum amplitude of vibration.

The vibrational amplitude distribution as a function along the length at the transducer 1, as shown in FIGS. 5a to 5i, can be verified experimentally by using conventional electronic frequency sweeping and mechanical vibration scanning techniques. The electrical frequency sweeping can be performed using conventional analytical instruments such as impedance analyzers, network analyzers, signal analyzers. The mechanical vibration scanning can be performed using conventional laser vibrometers, laser interferometers, and optical fiber sensors, or any other suitable conventional mechanical vibration scanning device.

Figure 6:
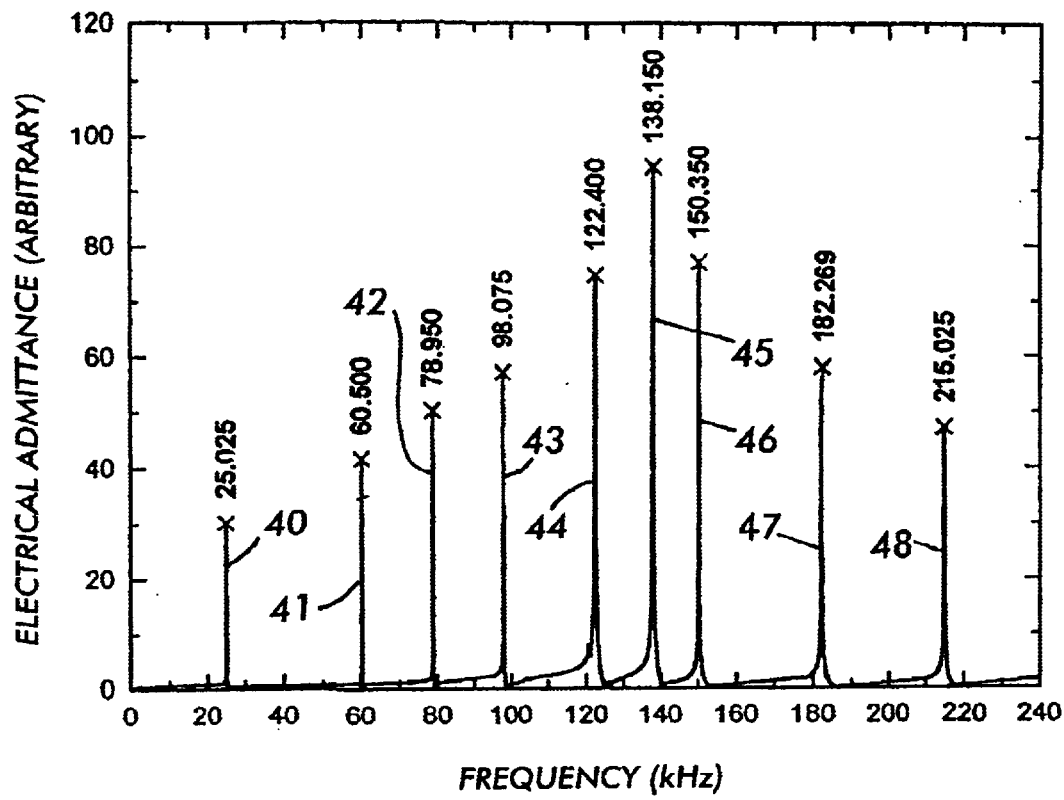
FIG. 6 is a graph of frequency versus electrical admittance for the ultrasonic transducer.

For example, FIG. 6 shows the electrical admittance (that is, the ratio of the electrical current to electrical voltage) is a function of frequency for the transducer 1. This shows that the nine vibrational modes 30–36 identified by the mathematical modeling methods and shown in FIGS. 5a to 5i, correspond with the first nine vibrational modes 40, 41, 42, 43, 44, 45, 46, 47, 48 found experimentally by measuring the electrical admittance as a function of frequency.

From a review of FIGS. 5a to 5i, it will be noted that in addition to the sixth mode 35 which is the specified design frequency of 138 kHz for the transducer 1, there are also substantially zero amplitudes of vibration at the energy generation plane 18 and the mounting plane 16 for the fourth mode 33. This mode 33 has a resonant frequency corresponding to 98 kHz. In addition, this mode 33 has a maximum amplitude of vibration at the capillary tip 5. Therefore, these results indicate that the transducer 1 may also be used to perform ultrasonic wire bonding operations at 98 kHz, which is a different frequency from the manufacturers specified design frequency of 138 kHz.

Figure 7:
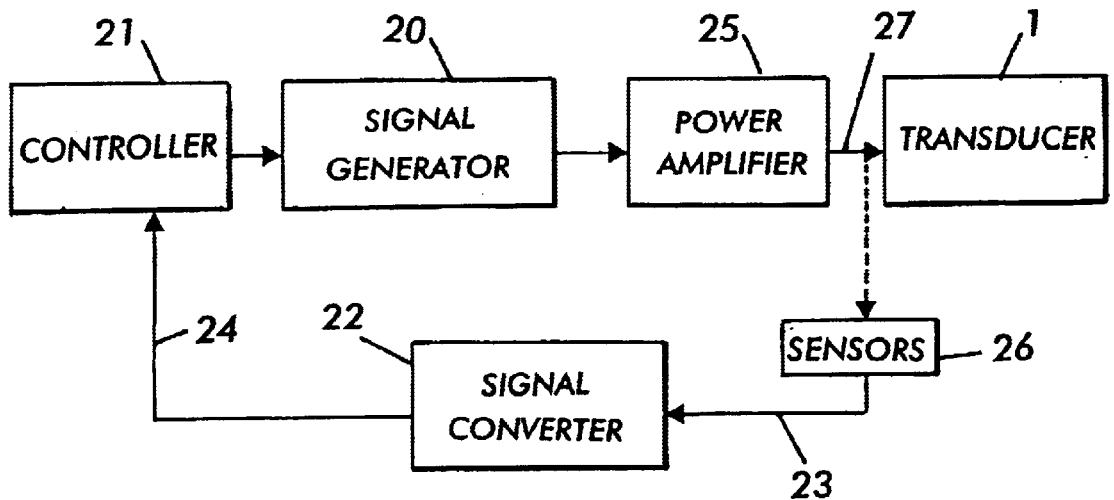
FIG. 7 is a block diagram showing a control system for operating the transducer.

After identifying the multi-frequency behaviour of the transducer 1, the transducer 1 can be incorporated into a wire bonding machine and controlled using a control system, shown schematically in FIG. 7. The control system comprises a programmable signal generator 20, a controller 21, a signal converter 22, sensors 26 and a power amplifier 25. The signal generator 20, the controller 21, the power amplifier 25 and the signal converter 22 permit the selection, tuning and locking of a resonant frequency chosen by an operator and also permit an operator to select different frequencies of operation for the transducer 1 for different bonding operations. The power amplifier 25 amplifies the output from the signal generator 20 and outputs the amplified signal 27 to the transducer 1 to drive the transducer 1. The signal converter 22 takes input signals 23 from the sensors 26 which sense the electric voltage and current of the signal 27, converts the input signals 23 to digital output signals 24, which are output to the controller 21. The controller 21 uses the signals 24 to control the signal generator 20 to maintain the frequency of the transducer 1 at the chosen resonant mode. The control system also permits programming and controlling of the wire bonder to generate different energy profiles for different resonant frequencies. The energy profiles may be set by adjusting the amplitude of the electrical voltage signal applied to the power amplifier 25 by the signal generator 20 to control the amplitude of the output signals to the transducer 1.

In use, the transducer 1, when operated by the control system shown in FIG. 7, may be used to perform bonding operations on a die-substrate assembly at one at the resonant modes 33, 38. For example, this may desirable due to differences in the materials being bonded. For example, one resonant mode may be used to bond a wire to a contact pad of a die and another resonant mode may be used to bond the wire to a contact area on a substrate.

Advantages of the invention include being able to operate a conventional ultrasonic transducer 1 at different frequencies in order to optimize the resonant frequency used for a particular bonding operation.

We claim:

1. A method of bonding wires between a semiconductor die and a substrate on which the die is mounted the method comprising the steps of:
   providing an ultrasonic transducer comprising an ultrasonic wave generation device, an ultrasonic vibration amplifying device coupled at one end to the ultrasonic wave generation device, a bonding tool coupled to the opposite end of the ultrasonic vibration amplifying device, and a mounting structure locate between the ends of the ultrasonic vibration amplifying device;
   performing a first wire bond by operating the ultrasonic transducer at a first ultrasonic frequency; and
   performing a second wire bond by operating the ultrasonic transducer at a second ultrasonic frequency, the second ultrasonic frequency being different from the first ultrasonic frequency; and
   selecting the first and second ultrasonic frequencies from among the frequencies of vibration of the energy generation device at which the vibration amplitude is:
      (i) substantially zero at an energy generation plane which is:
         perpendicular to a longitudinal axis extending between the ultrasonic generation device, the bonding tool, and the energy generation plane: and
         intersects the ultras generation device:
      (ii) substantially zero at a mounting plane which is:
         perpendicular to the longitudinal axis and
         coincident with a mounting contact point between the mounting structure and a wire bonding machine on which the transducer is mounted; and
      (iii) non-zero at a bonding plane which is:
         perpendicular to the longitudinal axis; and
         intersects the bonding tool.

2. A method according to claim 1, wherein the vibration amplitude is substantially maximum at the bonding plane.

3. A method according to claim 1, wherein the first wire bond is performed between a wire and a contact pad on the die and the second wire bond is performed between a wire and a contact area on the substrate.

4. A method according to claim 1, further comprising the steps of:
   identifying additional ultrasonic frequencies for which the vibration amplitude is substantially zero at the energy generation plane and at the mounting plane and non-zero at the bonding plane; and
   operating the transducer at select ones of the additional ultrasonic frequencies to perform further wire bonds, each of the selected frequencies being different from each other and different from the first and the second ultrasonic frequencies.

5. A method of bonding wires between a semiconductor die and a substrate on which the die is mounted comprising:
   providing an ultrasonic transducer comprising an ultrasonic energy generation device, an ultrasonic vibration amplifying device coupled at one end to the ultrasonic wave generation device, a bonding tool coupled to the opposite end of the ultrasonic vibration amplifying device, and a mounting structure located between the ends of the ultrasonic vibration amplifying device;
   identifying a first and a second ultrasonic frequency of vibration of the energy generation device at which the vibration amplitude is:
      (i) substantially zero at an energy generation plane, the energy generation plane being perpendicular to a longitudinal axis extending between the ultrasonic generation device and the bonding tool and the energy generation plane intersecting the ultrasonic generation device,
      (ii) substantially zero at a mounting plane, the mounting plane being perpendicular to the longitudinal axis and being coincident with a mounting contact point between the mounting structure and a wire bonding machine on which the transducer is mounted, and
      (iii) non-zero at a bonding plane, the bonding plane being perpendicular to the longitudinal axis and intersecting the bonding tool; and
   performing a first wire bond by operating the ultrasonic transducer at the first ultrasonic frequency and performing a second wire bond by operating the ultrasonic transducer at the second ultrasonic frequency, the second ultrasonic frequency being different from the first ultrasonic frequency.

6. A method according to claim 5, wherein the vibration amplitude is substantially a maximum at the bonding plane.

7. A method according to claim 5, wherein the first wire bond is performed between a wire and a contact pad on the die and the second wire bond is performed between a wire and a contact area on the substrate.

8. A method according to claim 5, further comprising the steps of: identifying additional ultrasonic frequencies for which the vibration amplitude is substantially zero at the energy generation plane and at the mounting plane and non-zero at the bonding plane; and
   operating the transducer at selected ones of the additional ultrasonic frequencies to perform further wire bonds, each of the selected frequencies being different from each other and different from the first and the second ultrasonic frequencies.

9. A method according to claim 2, wherein the first wire bond is performed between a wire and a contact pad on the die and the second wire bond is performed between a wire and a contact area on the substrate.

10. A method according to claim 2, further comprising the steps of:
    identifying additional ultrasonic frequencies for which the vibration amplitude is substantially zero at the energy generation plane and at the mounting plane and non-zero at the bonding plane; and
    operating the transducer at selected ones of the additional ultrasonic frequencies to perform further wire bonds, each of the selected frequencies being different from each other and different from the first and the second ultrasonic frequencies.

11. A method according to claim 6, wherein the first wire bond is performed between a wire and a contact pad on the die and the second wire bond is performed between a wire and a contact area on the substrate.

12. A method according to claim 6, further comprising the steps of:

identifying additional ultrasonic frequencies for which the vibration amplitude is substantially zero at the energy generation plane and at the mounting plane and non-zero at the bonding plane; and operating the transducer at selected ones of the additional ultrasonic frequencies to perform further wire bonds, each of the selected frequencies being different from each other and different from the first and the second ultrasonic frequencies.

13. A method according to claim 1, wherein the frequencies of vibration of the energy generation device from which the first and second frequencies are selected are determined by analyzing modes of the transducer which can be excited in a given frequency range.

14. A method according to claim 13, wherein the modes of vibration are modeled using finite element analysis.

15. A method according to claim 13, including the step of verifying a vibration amplitude distribution of the modes of vibration experimentally by using a technique selected from electronic frequency sweeping and mechanical vibration technique.

* * * * *